United States Patent
Schoen et al.

(10) Patent No.: US 7,889,030 B2
(45) Date of Patent: Feb. 15, 2011

(54) PASSIVE TEMPERATURE COMPENSATION OF SILICON MEMS DEVICES

(75) Inventors: Florian Schoen, Munich (DE); Robert Gruenberger, Nandlstadt (DE); Mohsin Nawaz, Unterhaching (DE); Bernhard Winkler, Munich (DE)

(73) Assignee: Infineon Technologies AG, Neubiberg (DE)

( * ) Notice: Subject to any disclaimer, the term of this patent is extended or adjusted under 35 U.S.C. 154(b) by 363 days.

(21) Appl. No.: 12/187,443

(22) Filed: Aug. 7, 2008

(65) Prior Publication Data

US 2010/0032789 A1 Feb. 11, 2010

(51) Int. Cl.
*H03H 9/24* (2006.01)
*H01L 29/84* (2006.01)
*H01L 21/00* (2006.01)

(52) U.S. Cl. .................. 333/234; 333/186; 257/415; 438/50; 438/53

(58) Field of Classification Search .......... 333/186, 333/234; 257/415; 438/50, 53
See application file for complete search history.

(56) References Cited

U.S. PATENT DOCUMENTS 7,071,793 B2 7/2006 Lutz et al.
7,202,761 B2 4/2007 Lutz et al.
7,639,104 B1 * 12/2009 Quevy et al. ............ 333/186
2007/0188269 A1 8/2007 Lutz et al.

FOREIGN PATENT DOCUMENTS

WO 2007072409 A1 6/2007

OTHER PUBLICATIONS

Hopcroft et al., A High-Stability MEMS Frequency Reference, Transducers & Eurosensors 2007, 14th International Conference on Solid-State Sensors, Actuators and Microsystems, Lyon, France, Jun. 10-14, 2007, pp. 1307-1309, IEEE (3 pages).
Hsu et al., Frequency Trimming for MEMS Resonator Oscillators, Ann Arbor, Michigan, USA, 2007, pp. 1088-1091, IEEE (4 pages).
Kim et al., Si-SiO2 Composite MEMS Resonators in CMOS Compatible Wafer-scale Thin-Film Encapsulation; IEEE-FCS '07 Conference at Geneva, Switzerland, 2007, pp. 1214-1219, IEEE (6 pages).
Hopcroft et al., Temperature Compensation of a MEMS Resonator using Quality Factors as a Thermometer, MEMS 06, 2006, pp. 222-225, IEEE (4 pages).
De et al., Theory of Thermoelastic Damping in Electrostatically Actuated Microstructures, Physical Review, Oct. 17, 2006, American Physical Society, pp. 144305-1-144305-13 (13 pages).

* cited by examiner

*Primary Examiner*—Evan Pert
(74) *Attorney, Agent, or Firm*—Patterson Thuente Christensen Pedersen, P.A.

(57) ABSTRACT

The invention relates to MEMS devices. In one embodiment, a micro-electromechanical system (MEMS) device comprises a resonator element comprising a semiconducting material, and at least one trench formed in the resonator element and filled with a material comprising oxide. Further embodiments comprise additional devices, systems and methods.

25 Claims, 5 Drawing Sheets

PASSIVE TEMPERATURE COMPENSATION OF SILICON MEMS DEVICES

BACKGROUND

The temperature dependence of the mechanical parameters of silicon creates challenges in the use of silicon in microelectromechanical system (MEMS) devices. For example, the elastic modulus of silicon varies by about −88 ppm/K. Thus, the stiffness or flexibility of a silicon MEMS device or component is dependent upon the temperature. The resonant frequency of a resonator or filter is defined by $$f = \frac{1}{2\pi}\sqrt{\frac{k}{m}}$$

where k is the stiffness and m the mass of the resonator. Accordingly, the resonant frequency will shift with temperature to smaller values. Frequency shifts of up to −45 K/ppm have been observed. To utilize silicon MEMS resonators as frequency reference devices, which can require an overall frequency accuracy of up to 2 ppm, temperature compensation techniques are often used.

Current temperature compensation techniques include active and passive techniques that attempt to compensate for the $T_{cf}$. Active techniques in this context refer to techniques which utilize active elements, such as circuitry. One example of an active temperature compensation techniques includes a fractional phase-locked loop (PLL) combined with a temperature sensor and an A/D converter. In another example, temperature compensation can be accomplished by exploiting the bias voltage dependence of the resonant frequency. A third example known in the art involves actively heating the resonator to keep it at a controlled temperature.

Passive techniques using silicon dioxide or other materials have been proposed, wherein the softening of the silicon is counteracted by combining the silicon with some other material that exhibits favourable characteristics. For example, the silicon can be combined with a second material that gets stiffer rather than softer with temperature. One particular example of such a technique includes a monocrystaline silicon resonator surrounded by an oxide layer. Such an approach, however, in which the resonator is surrounded by oxide, leads to a degradation of other important parameters, including the electromechanical coupling, which accounts for the energy being transferred from the electrical to the mechanical domain and back. In an electrostatically actuated resonator, the electromechanical coupling can be expressed as:

$$\eta = \frac{\varepsilon A}{d^2 u_{Bias}}$$

where $\varepsilon$ is the dielectric constant in the electrical active gap, A the coupling area, d the gap distance between the resonator and the driving electrode and $U_{Bias}$ the applied bias voltage. As can be seen from the above equation, the electromechanical coupling is dependant upon the square of the gap d. Further, the motional resistance, which is a measure of the impedance of the resonator in series resonance, is dependant upon the square of the electromechanical coupling, η:

$$R = \frac{\sqrt{km}}{Q\eta^2}$$

where Q is the quality factor of the resonator. Considering that a typical electrical gap is in the range of several hundred nanometers and that an oxide film needs a thickness of one to several micrometers, depending upon the resonator geometry, the motional resistance will dramatically increase. This will in turn significantly degrade the performance of the resonator. Additionally, because there is an interface between oxide and silicon, the quality factor of the resonator will further degrade through interfacial losses.

SUMMARY

Embodiments of the invention are related to MEMS devices. In one embodiment, a micro-electromechanical system (MEMS) device comprises a resonator element comprising a semiconducting material, and at least one trench formed in the resonator element and filled with a material comprising oxide.

In another embodiment, a MEMS device comprises a moveable element having a first temperature coefficient of elastic modulus, and at least one trench formed in the moveable element and filled with a material having a second temperature coefficient of elastic modulus different from the first temperature coefficient of elastic modulus.

In yet another embodiment, a trench is formed in a moveable portion of a MEMS device, and the trench is filled with a material having a temperature coefficient of elastic modulus different from a temperature coefficient of elastic modulus of the moveable portion.

Further embodiments comprise additional devices, systems and methods.

BRIEF DESCRIPTION OF THE DRAWINGS

The invention may be more completely understood from the following detailed description of various embodiments in connection with the accompanying drawings, in which.

Figure 1:
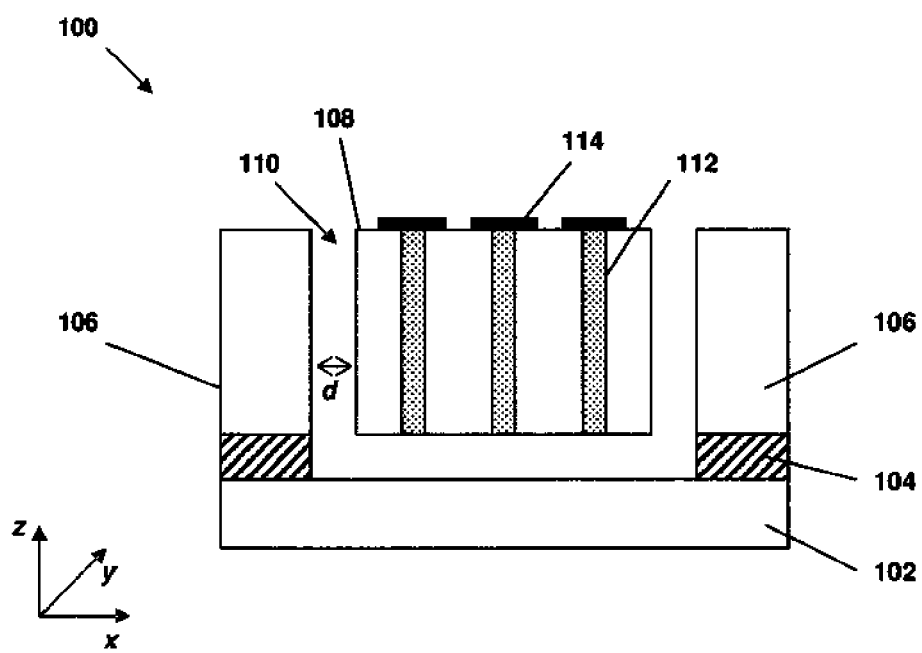
FIG. 1 is a sectional side view of a MEMS device according to one embodiment.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention as defined by the appended claims.

DETAILED DESCRIPTION

Embodiments of the invention relate to micro-electromechanical system (MEMS) devices and temperature compensation techniques thereof. Various embodiments of the invention provide devices, systems and methods for compensation of the temperature coefficient of resonant frequency ($T_{cf}$) of MEMS resonators, filters and other devices and structures using passive techniques. Additionally, embodiments of the invention improve the quality factor of MEMS resonators, filters and other devices by reducing thermoelastic losses. Further, embodiments of the invention can compensate for the degradation, with temperature, of the elastic modulus of silicon in MEMS devices.

Various embodiments of the invention can be more readily understood by reference to FIGS. 1-8 and the following description. While the invention is not necessarily limited to the specifically depicted embodiment(s) and application(s), the invention will be better appreciated using a discussion of exemplary embodiments in specific contexts.

In one embodiment, a MEMS device comprises at least one filled trench. The at least one filled trench can compensate for degradation of device performance with temperature, in one embodiment, by keeping the overall stiffness of the MEMS device constant, independent of the temperature. Additionally, this filled-trench technique can enhance the quality factor of the MEMS device, such as a resonator or filter, by changing the thermal properties of the device. Further, embodiments of the invention can still comprise very small adjusted electrical gaps, thereby providing low motional resistances and highly temperature compensated devices at the same time.

Figure 2:
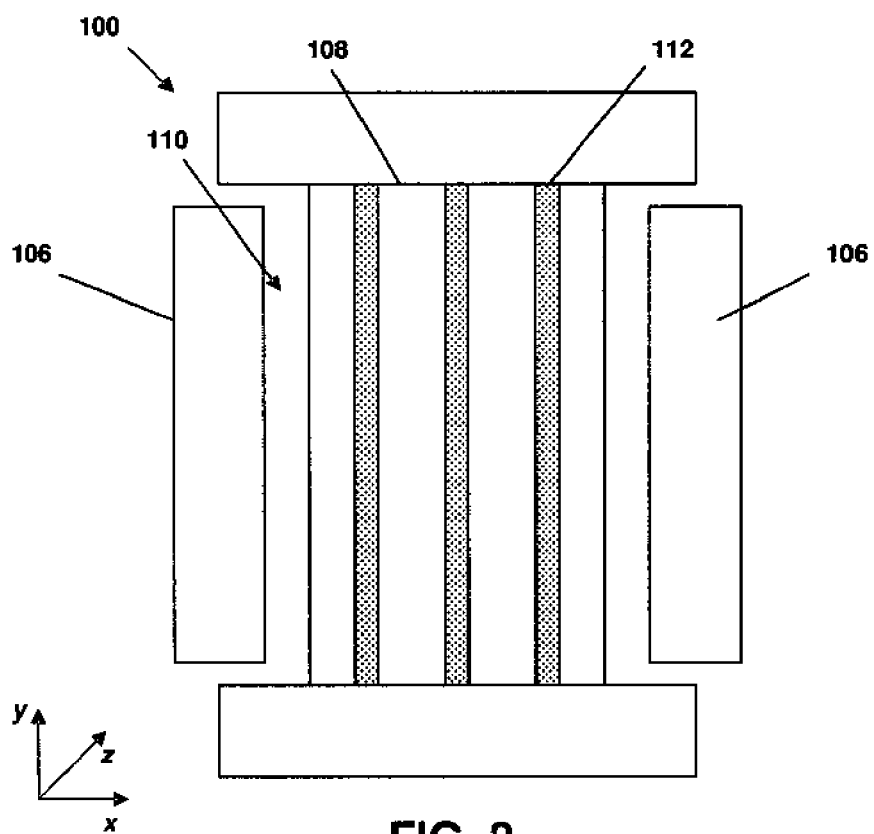
FIG. 2 is a sectional top view of the device of FIG. 1.

In FIGS. 1 and 2, an embodiment of a silicon MEMS device 100 is depicted. In one embodiment, device 100 comprises a resonator device. In other embodiments, device 100 comprises a filter or some other MEMS structure. In general, embodiments of the invention have applicability to any MEMS system or device in which it is desired to tune the mechanical parameters.

Device 100 is formed on a substrate 102, and an insulating layer 104, such as silicon dioxide in one embodiment, is formed on substrate 102 in one embodiment. An electrode 106 is formed on layer 104.

Device 100 further comprises a resonator element 108. Resonator element 108 is separated from electrode 106 by a cavity 110. Resonator element 108 moves or resonates in the x-y plane as depicted in FIGS. 1 and 2, although resonators can be designed such that they resonate in other planes, as in other embodiments. In one embodiment, resonator element 108 comprises silicon. In other embodiments, resonator element 108 comprises silicon germanium (SiGe) or some other appropriate semiconducting material known to one skilled in the art. Although the term resonator element is used herein, it need not refer to a resonator per se but rather a movable portion of a MEMS device, which can comprise a sensor, filter, microphone, resonator and the like, as mentioned herein above.

In one embodiment, resonator element 108 comprises at least one filled trench 112. In the embodiment of FIGS. 1 and 2, resonator element 108 comprises three filled trenches 112, although in other embodiments resonator element 108 can comprise more or fewer filled trenches. The trenches 112 are depicted as extending longitudinally and being evenly spaced within resonator element 108 in the embodiment of FIGS. 1 and 2, but other spacings, layouts and configurations can be used in other embodiments as described in more detail in various examples below.

Trenches 112 can be filled with an oxide material, such as silicon dioxide, in one embodiment. In other embodiments, alternate materials are used which provide a desired temperature compensation or other effect, although generally materials are selected which become more stiff as temperature increases, having a coefficient of thermal expansion and/or a temperature coefficient of elastic modulus which is different from that of the material(s) which comprise resonator element 108. During fabrication, trenches 112 can be formed within resonator element 108 and subsequently refilled. To protect trenches 112 during subsequent processing, such as etching, caps 114 can be deposited in one embodiment. In the embodiment of FIG. 1, caps 114 are disposed on a first end of trenches 112.

Figure 3:
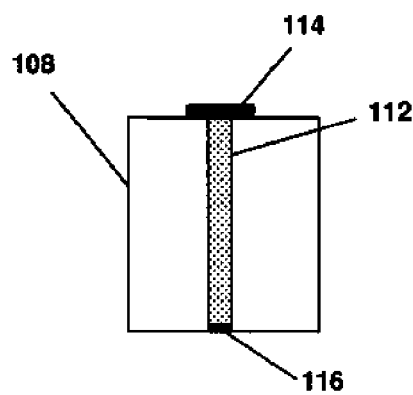
FIG. 3 is a sectional side view of a resonator element according to one embodiment.

In FIG. 3, another embodiment is depicted in which a cap layer 116 is disposed at a second end of trench 112. Cap layer 116 can be helpful to further protect trench 112, such as during a release etch process in the fabrication of resonator 100. An additional benefit provided by the embodiment of FIG. 3 is improved electrical contact.

Figure 4:
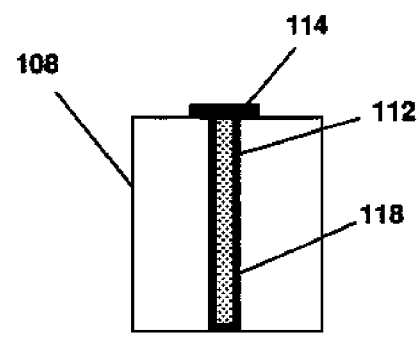
FIG. 4 is a sectional side view of a resonator element according to one embodiment.

FIG. 4 depicts yet another embodiment, in which trench 112 is protected by layer 118. Layer 118, as well as cap 114 and cap layer 116, can comprise polysilicon in one embodiment or other suitable materials in other embodiments, such as metal or some other conducting material or, in some embodiments, a non-conducting material.

Figure 5:
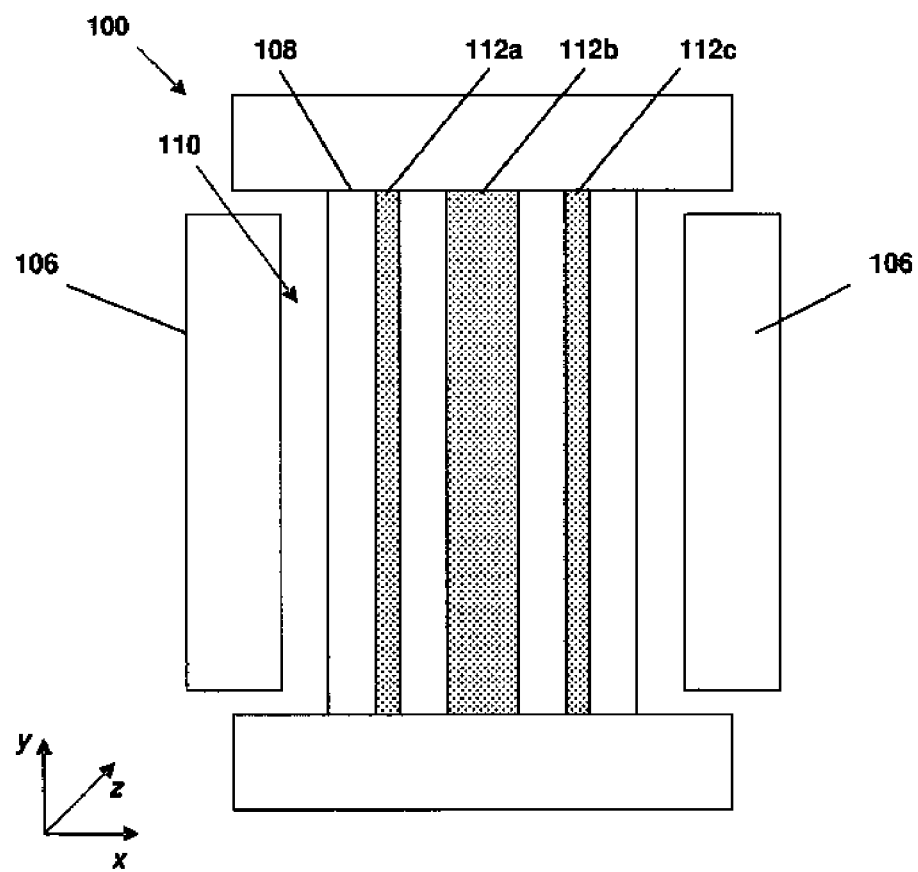
FIG. 5 is a sectional top view of a MEMS device according to one embodiment.
Figure 6:
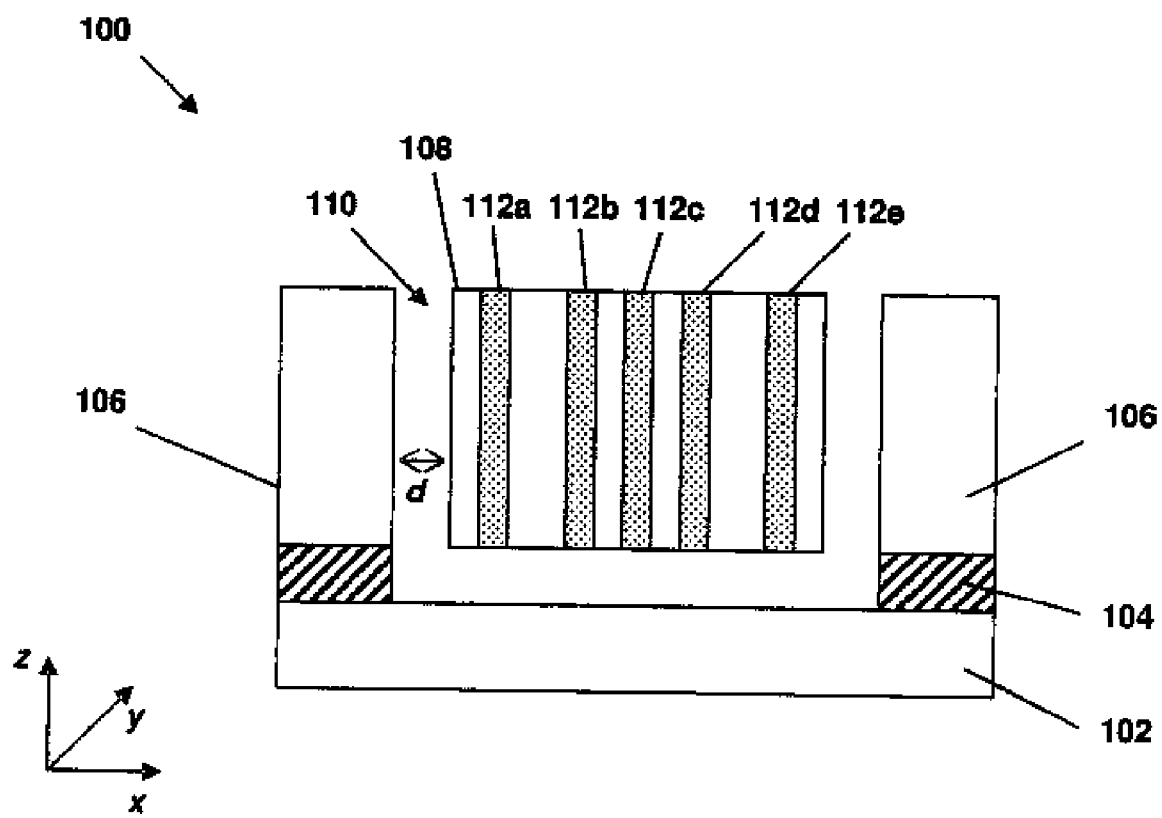
FIG. 6 is a sectional side view of a MEMS device according to one embodiment.

In embodiments comprising a plurality of trenches 112, each trench 112 need not have the same dimensions and configuration. In FIG. 5, for example, trench 112b is wider than trenches 112a and 112b, while in FIG. 6, the distances separating trenches 112a and 112b and trenches 112d and 112e, respectively, are greater than the intermediate distances between trenches 112b, 112c, and 112d. Further, one or more trenches 112 can extend all the way through or only partly through resonator element 108, from a height, depth or width perspective. Trenches 112 can also extend laterally within resonator element 108, rather than longitudinally with respect to the orientation depicted, in other embodiments. The number, placement, dimensions and configuration of the at least one trench can be selected according to a desired effect or application in various embodiments.

Additionally, the number, layout and configuration of trench 112 can vary according to a design or geometry of resonator 108. In FIGS. 1 and 2, resonator 108 comprises a clamped-clamped resonator structure. In other embodiments, resonator 108 can comprise a beam anchored at a first end (clamp-free), a free-free resonator structure, a resonator structure anchored on a top and/or bottom side, a disc or wheel-shaped, or some other configuration.

Figure 7:
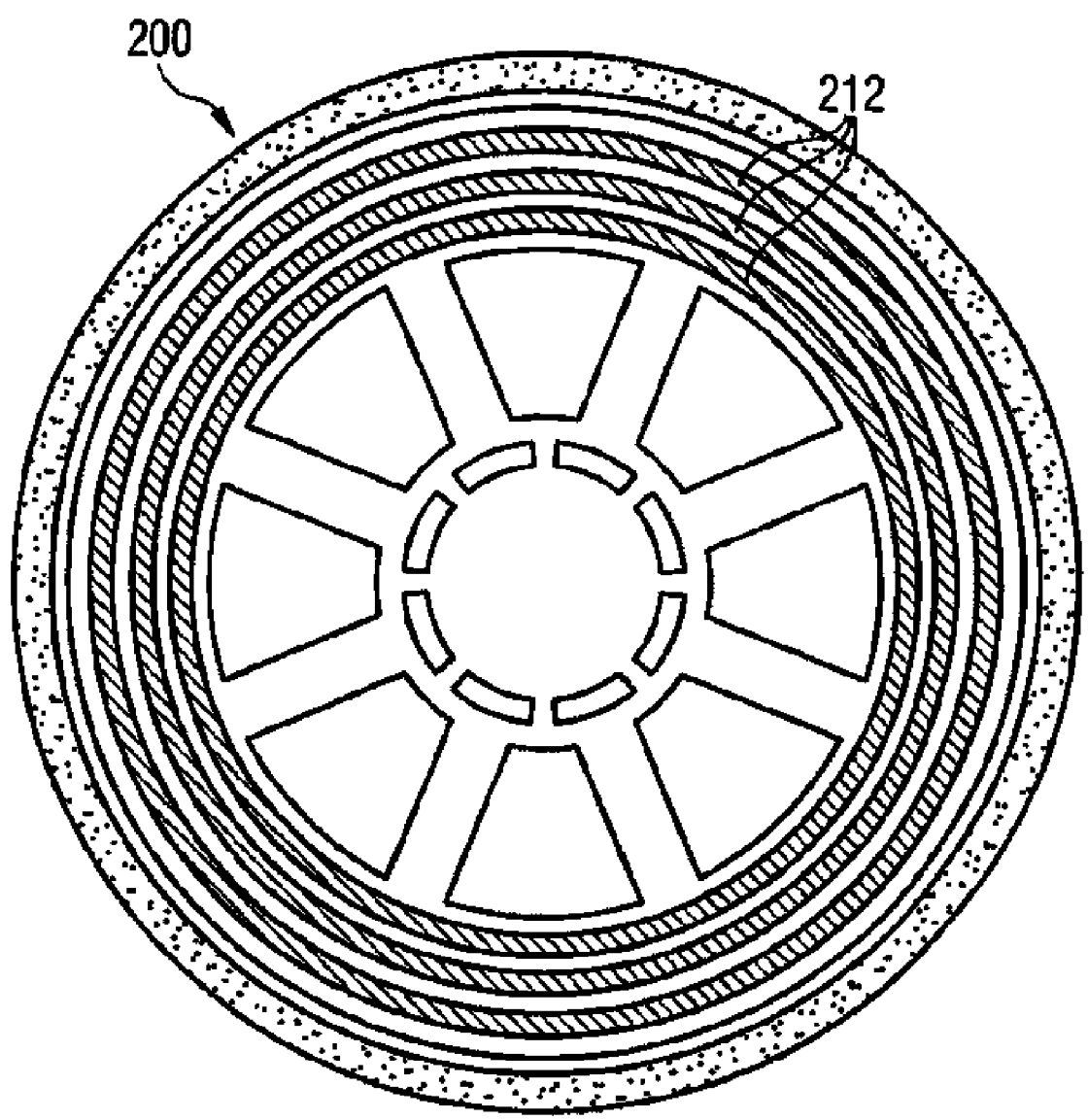
FIG. 7 is a sectional top view of a MEMS device according to one embodiment.

For example, a MEMS wheel device 200 is depicted in FIG. 7. Wheel device 200 comprises a plurality of trenches 212 extending in concentric rings. Although three trenches 212 are depicted, device 200 can comprise more or fewer trenches in other embodiments. Trenches 212 can extend all or partly through device 200. In one embodiment, at least one trench 212 is segmented, or comprises a plurality of individual radial trench portions, such that it does not form a contiguous ring in device 212. Other characteristics of device 200 and trench 212, such as material compositions, fill materials, capping, and the like, can be similar to the various embodiments described herein with reference to device 100.

Figure 8:
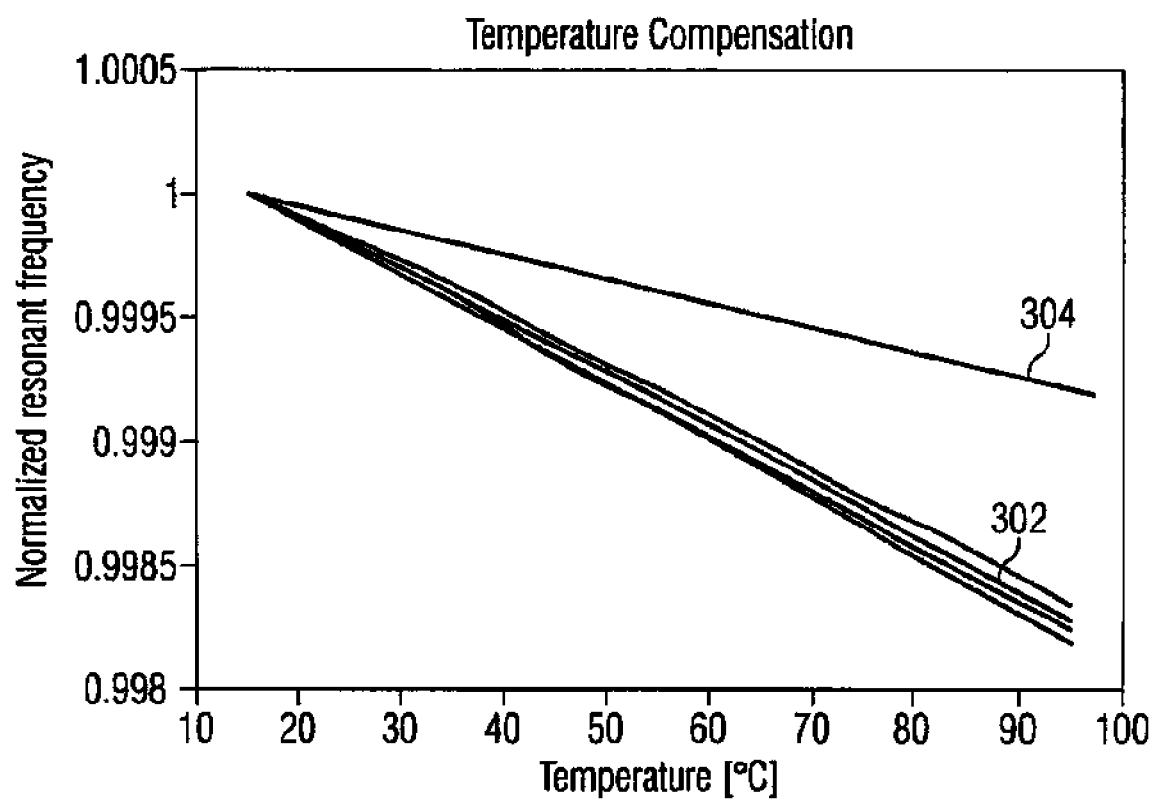
FIG. 8 is a graphical depiction of experimental results according to one embodiment.

FIG. 8 depicts a graph of the resonant frequency of different test devices as temperature varies, according to one embodiment. The test device comprised a 13-MHz four-beam resonator, similar to the embodiment of FIG. 7. The comparison device, similar to the embodiment of FIG. 7 but without trenches 212, had an initial temperature coefficient of resonant frequency ($T_{cf}$) of more than −21 ppm/K, shown at 302, while the test device showed a exhibited a reduced $T_{cf}$ of less than −10 ppm/K, shown at 304. Additional simulations were also carried out for clamped-clamped beams, similar to device 100 of FIGS. 1 and 2, the results of which were also positive. Thus the addition of trenches, such as those filled with silicon dioxide as described herein, can lead to an accuracy over temperature range that is better than ±50 ppm.

Embodiments of the invention thus provide several advantages, such as passive temperature compensation, low motional resistance and improved quality factor. Regarding the quality factor, additional aspects can be considered. In various embodiments of the invention, an interface between silicon and silicon dioxide is created. This interface can potentially create additional location for losses. Internal thermal heatflows through local compression and expansion, often referred as thermoelastic dissipation (TED), are one of the dominant loss mechanisms in silicon MEMS resonators, however. In general, such losses are dependant upon the thermal characteristics (e.g., thermal conductivity) of the materials used. By inserting a different material, such as an oxide material in various embodiments, this loss can be greatly reduced because of a change in the thermal conductivity at parts of the resonator. Thus, filling the resonator partially with oxide will lead to lower TED and the total quality factor of the resonator can be enhanced.

Compared to active temperature compensation techniques, additional advantages are provided by embodiments of the invention. For example, because the passive compensation techniques of embodiments of the invention are an intrinsic feature of the MEMS device, these techniques do not require any additional power, which can be crucial in many applications, such as mobile applications, like mobile phones and sensor networks, and tire pressure monitoring systems. Further, active systems typically require an additional temperature sensor, sometimes combined with an A/D converter, which can be a source of inaccuracies or temperature compensation limiters.

Although specific embodiments have been illustrated and described herein for purposes of description of an example embodiment, it will be appreciated by those of ordinary skill in the art that a wide variety of alternate and/or equivalent implementations calculated to achieve the same purposes may be substituted for the specific embodiments shown and described without departing from the scope of the present invention. Those skilled in the art will readily appreciate that the invention may be implemented in a very wide variety of embodiments. This application is intended to cover any adaptations or variations of the various embodiments discussed herein, including the disclosure information in the attached appendices. Therefore, it is manifestly intended that this invention be limited only by the claims and the equivalents thereof.

The invention claimed is:

1. A micro-electromechanical system (MEMS) device comprising:
    a resonator element comprising a semiconducting material; and
    at least one trench formed in the resonator element and filled with a material comprising oxide.

2. The MEMS device of claim 1, further comprising:
    a cavity; and
    an electrode defining at least a portion of the cavity, wherein the resonator element is disposed in the cavity spaced apart from the electrode.

3. The MEMS device of claim 1, wherein the resonator element is fixed at a first end.

4. The MEMS device of claim 3, wherein the resonator element is fixed at a second end.

5. The MEMS device of claim 1, wherein the resonator element and the at least one trench each have a circumference.

6. The MEMS device of claim 5, wherein the at least one trench comprises a plurality of trench segments spaced apart from each other.

7. The MEMS device of claim 1, wherein the at least one trench comprises a plurality of trenches spaced apart from each other.

8. The MEMS device of claim 1, further comprising a cap formed on a first end of the at least one trench.

9. The MEMS device of claim 8, further comprising a cap layer formed on a second end of the at least one trench.

10. The MEMS device of claim 9, wherein the trench is lined with a material.

11. The MEMS device of claim 8, wherein the cap comprises at least one of polysilicon, a metal material, or a conducting material.

12. The MEMS device of claim 1, wherein the semiconducting material comprises one of silicon or silicon germanium.

13. A micro-electromechanical system (MEMS) device comprising:
    a moveable element having a first temperature coefficient of elastic modulus; and
    at least one trench formed in the moveable element and filled with a material having a second temperature coefficient of elastic modulus different from the first temperature coefficient of elastic modulus.

14. The MEMS device of claim 13, wherein the moveable element comprises a semiconducting material and the material having a second temperature coefficient of elastic modulus comprises an oxide.

15. The MEMS device of claim 13, wherein the moveable element comprises a resonator.

16. The MEMS device of claim 13, further comprising a cap material deposited over a first end of the at least one trench.

17. The MEMS device of claim 16, wherein the cap material lines the trench.

18. The MEMS device of claim 16, wherein the cap material is deposited in a second end of the at least one trench.

19. The MEMS device of claim 16, wherein the cap material comprises polysilicon.

20. The MEMS device of claim 13, wherein the moveable element and the at least one trench each have a circumference, and wherein the circumference of the at least one trench is smaller than the circumference of the moveable element.

21. A method comprising:
    forming a trench in a moveable portion of a micro-electromechanical system (MEMS) device; and
    filling the trench with a material having a temperature coefficient of elastic modulus different from a temperature coefficient of elastic modulus of the moveable portion.

22. The method of claim 21, further comprising:
    depositing a material layer over a first end of the trench.

23. The method of claim 21, further comprising:
    lining the trench with a material layer.

24. The method of claim 21, further comprising:
    causing the moveable portion to resonate; and
    determining a resonant frequency of the moveable portion.

25. The method of claim 21, wherein the device comprises silicon.

* * * * *